United States Patent
Kim

(10) Patent No.: US 12,396,136 B2
(45) Date of Patent: Aug. 19, 2025

(54) BUSBAR ASSEMBLY COOLING APPARATUS AND ELECTRIC POWER INVERTER MODULE HAVING THE SAME

(71) Applicants: Hyundai Motor Company, Seoul (KR); Kia Corporation, Seoul (KR)

(72) Inventor: Yun Ho Kim, Seoul (KR)

(73) Assignees: Hyundai Motor Company, Seoul (KR); Kia Corporation, Seoul (KR)

( * ) Notice: Subject to any disclaimer, the term of this patent is extended or adjusted under 35 U.S.C. 154(b) by 270 days.

(21) Appl. No.: 18/116,716

(22) Filed: Mar. 2, 2023

(65) Prior Publication Data

US 2024/0074123 A1    Feb. 29, 2024

(30) Foreign Application Priority Data

Aug. 26, 2022  (KR) ........................ 10-2022-0107685

(51) Int. Cl.
*H05K 7/20*  (2006.01)
*H05K 7/14*  (2006.01)

(52) U.S. Cl.
CPC ..... *H05K 7/20445* (2013.01); *H05K 7/14329* (2022.08); *H05K 7/20154* (2013.01)

(58) Field of Classification Search
None
See application file for complete search history.

(56) References Cited

U.S. PATENT DOCUMENTS

| | | | | |
|---|---|---|---|---|
| 8,582,291 B2 * | 11/2013 | Nakasaka | ........... | H01L 23/4093 361/677 |
| 8,687,370 B2 * | 4/2014 | Landau | ................ | H01L 23/055 361/764 |
| 2002/0024120 A1 * | 2/2002 | Yoshimatsu | ......... | H05K 9/0022 257/659 |
| 2003/0133319 A1 * | 7/2003 | Radosevich | .......... | H02M 7/003 363/141 |
| 2010/0091464 A1 * | 4/2010 | Ohnishi | ................ | H01L 23/645 29/890.03 |
| 2013/0265724 A1 * | 10/2013 | Kaneko | ................... | H01L 25/18 361/715 |
| 2016/0081233 A1 * | 3/2016 | Nagasawa | .......... | H05K 7/14329 361/699 |
| 2016/0322281 A1 | 11/2016 | Shintani et al. | | |

(Continued)

FOREIGN PATENT DOCUMENTS

| KR | 10-2007-0067065 | 6/2007 |
|---|---|---|
| KR | 10-2015-0143060 | 12/2015 |

(Continued)

*Primary Examiner* — Courtney L Smith
(74) *Attorney, Agent, or Firm* — MORGAN, LEWIS & BOCKIUS LLP

(57) ABSTRACT

In a busbar assembly cooling apparatus, insulation performance and cooling performance are ensured even though a size of a thermal conductor, which is configured as a thermal pad for insulating and cooling a busbar, is reduced. Furthermore, because the size of the thermal pad is reduced, an internal space is ensured, and weight and cost are reduced. Furthermore, a busbar assembly cooling apparatus and an electric power inverter module having the same are introduced, in which a space through which the busbar may be exposed, is blocked and sealed so that stability related to management of the busbar is ensured, and reliability of an inverter is improved.

19 Claims, 7 Drawing Sheets

(56) References Cited

U.S. PATENT DOCUMENTS

| | | | |
|---|---|---|---|
| 2017/0018884 A1 | 1/2017 | Hayase et al. | |
| 2017/0324201 A1 | 11/2017 | Schepis et al. | |
| 2018/0303001 A1* | 10/2018 | Suwa | H05K 7/2089 |
| 2019/0159367 A1 | 5/2019 | Umino | |
| 2021/0144887 A1 | 5/2021 | Hoyler | |
| 2023/0142008 A1* | 5/2023 | Sim | H02P 27/04 |
| | | | 324/765.01 |
| 2024/0038611 A1* | 2/2024 | Tang | H01L 23/3121 |

FOREIGN PATENT DOCUMENTS

| | | |
|---|---|---|
| KR | 10-2017-0055605 | 5/2017 |
| KR | 10-2019-0069963 | 6/2019 |
| KR | 10-2020-0138088 | 12/2020 |

\* cited by examiner

BUSBAR ASSEMBLY COOLING APPARATUS AND ELECTRIC POWER INVERTER MODULE HAVING THE SAME

CROSS REFERENCE TO RELATED APPLICATION

The present application claims priority to Korean Patent Application No. 10-2022-0107685 filed on Aug. 26, 2022, the entire contents of which is incorporated herein for all purposes by this reference.

BACKGROUND OF THE PRESENT DISCLOSURE

Field of the Present Disclosure

The present disclosure relates to a busbar assembly cooling apparatus and an electric power inverter module having the same, and more particularly, to a busbar assembly cooling apparatus and an electric power inverter module having the same, which are capable of ensuring performance in cooling and insulating a busbar.

Description of Related Art

An electric power conversion apparatus for an environmental-friendly vehicle receives direct current (DC) from a high-voltage battery, converts the direct current into alternating current (AC), and supplies the alternating current to a motor. The alternating current outputted from the electric power conversion apparatus changes in magnitude and phase in response to a signal inputted to the electric power conversion apparatus from a vehicle by manipulation by a user. The alternating output current controls torque and a rotation speed of the motor.

In general, the current flowing in the electric power conversion apparatus flows through a busbar made of copper. When the current flows through the busbar, the busbar is heated by internal resistance. When a temperature of the busbar increases to a predetermined temperature or higher, busbar components are damaged so that a plastic mold for surrounding an external portion of the busbar is melted, and plating is separated from the busbar. For the present reason, the electric power conversion apparatus may be short-circuited and burnt out. Therefore, a cross-sectional area of the busbar needs to be determined depending on a magnitude of the current flowing through the electric power conversion apparatus.

However, because an output of a motor system gradually increases as the environmental-friendly vehicle is popularized, the alternating output current supplied from the electric power conversion apparatus needs to be increased to increase the output of the motor system. Therefore, the cross-sectional area of the busbar in the electric power conversion apparatus gradually increases. However, as the cross-sectional area of the busbar increases, the weight and price of the busbar increase, the competitiveness of the electric power conversion apparatus deteriorates, and an overall size of the electric power conversion apparatus increases, which makes it difficult to form internal components.

The information included in this Background of the present disclosure is only for enhancement of understanding of the general background of the present disclosure and may not be taken as an acknowledgement or any form of suggestion that this information forms the prior art already known to a person skilled in the art.

BRIEF SUMMARY

Various aspects of the present disclosure are directed to providing a busbar assembly cooling apparatus and an electric power inverter module having the same, which ensure performance in cooling and insulating a busbar.

According to one aspect, there is provided a busbar assembly cooling apparatus including: a busbar assembly including a busbar through which current flows, and a mold portion including an external shape and configured so that the busbar is accommodated thereon; a cooling cover coupled to the busbar assembly and configured to cool the busbar assembly by heat exchange; and a thermal conductor located between the mold portion and the cooling cover coupled to the mold portion of the busbar assembly, wherein the thermal conductor is configured to block a flow of current while coming into contact with the busbar and allow the busbar and the cooling cover to exchange heat with each other, in which the mold portion of the busbar assembly and the cooling cover are structured to be inserted into the thermal conductor in a direction in which the mold portion and the cooling cover face the thermal conductor, ensuring an insulation distance of the busbar.

The mold portion may have an extension portion protruding outwardly from the busbar and configured to be inserted into the thermal conductor, the cooling cover may have a protruding portion protruding in a shape configured for being inserted into the extension portion and configured to be inserted into the thermal conductor, and the extension portion and the protruding portion may define a concave-convex structure.

The extension portion of the mold portion may extend so that a protruding length of the extension portion is greater than a thickness of the busbar.

A protruding length of the protruding portion of the cooling cover may be shorter than a protruding length of the extension portion of the mold portion.

An area of the busbar may be smaller than an area of the protruding portion of the cooling cover.

The extension portion of the mold portion may have a chamfer formed by obliquely cutting an end portion of the extension portion of the mold portion.

According to various aspects of the present disclosure, there is provided an electric power inverter module including: a capacitor configured to be supplied with direct current from a battery; a power module mounted outside the capacitor; a cooler configured to cool the power module by a flow of a cooling medium; a busbar assembly mounted outside the power module and including a busbar configured to electrically connect a driving portion and the power module, and a mold portion including an external shape and configured so that the busbar is accommodated thereon; a cooling cover coupled to the busbar assembly and configured to cool the busbar assembly by heat exchange; and a thermal conductor located between the mold portion and the cooling cover coupled to the mold portion of the busbar assembly, wherein the thermal conductor is configured to block a flow of current while coming into contact with the busbar and allow the busbar and the cooling cover to exchange heat with each other.

The mold portion of the busbar assembly and the cooling cover may be structured to be inserted into the thermal conductor in a direction in which the mold portion and the cooling cover face the thermal conductor.

The mold portion may have an extension portion extending to surround an external periphery of the busbar and configured to be inserted into the thermal conductor, the cooling cover may have a protruding portion protruding in a shape configured for being inserted into the extension portion and configured to be inserted into the thermal conductor, and the extension portion and the protruding portion may define a concave-convex structure.

The power module may include a first power module and a second power module, and the cooler may be disposed between the first power module and the second power module.

The power module may further include a third power module, and the third power module may be disposed outside the capacitor and mounted at a position different from positions of the first and second power modules.

The electric power inverter module may further include: an integrated control board mounted at an upper side of the capacitor and configured to control operations of the first power module, the second power module, and the third power module; and a board guide configured to couple the integrated control board to the upper side of the capacitor and insulate the integrated control board.

The busbar assembly may be mounted outside the second power module and electrically connect the driving portion and the first power module.

The electric power inverter module may further include an output busbar mounted at a lower side of the capacitor and configured to electrically connect the driving portion and the second power module.

The busbar assembly cooling apparatus and the electric power inverter module having the same, which are structured as described above, ensure the insulation performance and the cooling performance even though the size of the thermal conductor, which is configured as a thermal pad for insulating and cooling the busbar, is reduced. Furthermore, because the size of the thermal pad is reduced, an internal space is ensured, and weight and cost are reduced.

Furthermore, a space through which the busbar may be externally exposed is blocked and sealed so that the stability related to the management of the busbar is ensured, and the reliability of the inverter is improved.

The methods and apparatuses of the present disclosure have other features and advantages which will be apparent from or are set forth in more detail in the accompanying drawings, which are incorporated herein, and the following Detailed Description, which together serve to explain certain principles of the present disclosure.

Figure 1:
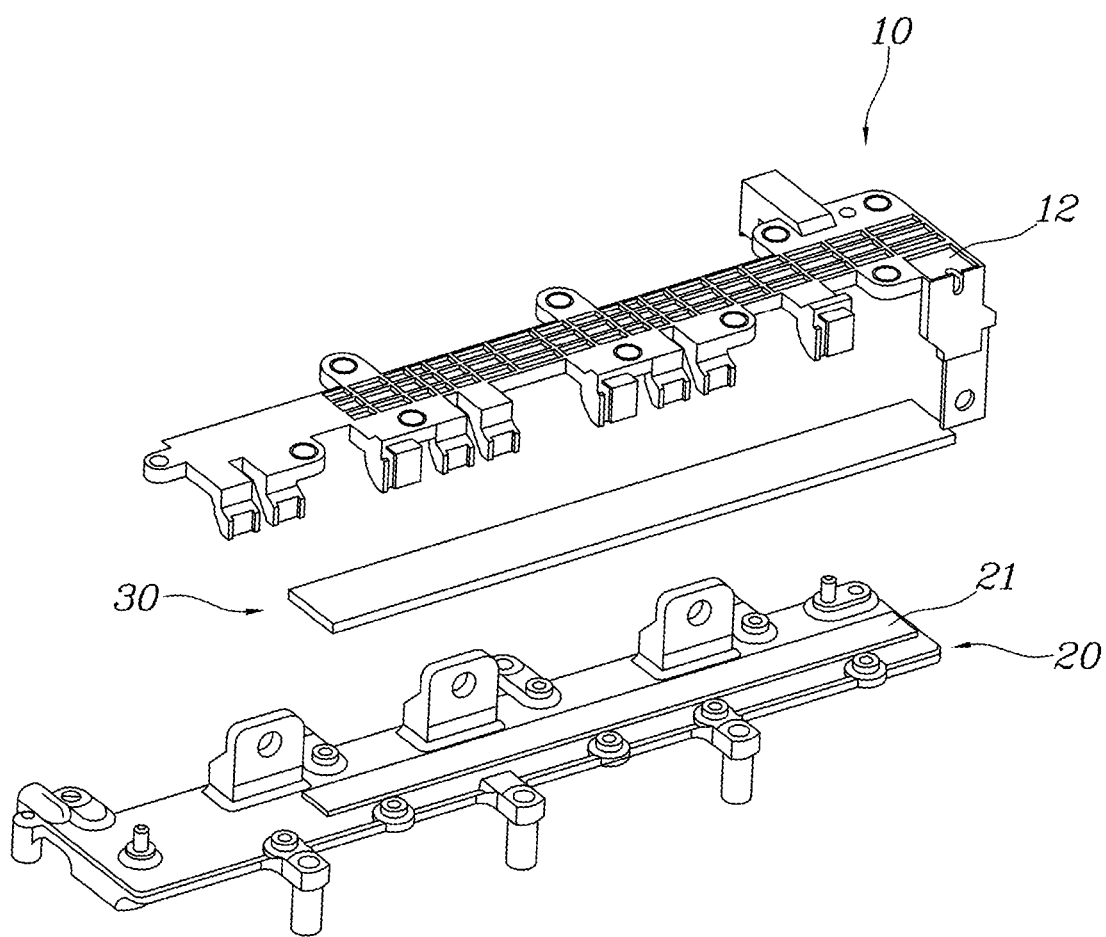
FIG. 1 is a view exemplarily illustrating a busbar assembly cooling apparatus according to an exemplary embodiment of the present disclosure.

It may be understood that the appended drawings are not necessarily to scale, presenting a somewhat simplified representation of various features illustrative of the basic principles of the present disclosure. The specific design features of the present disclosure as included herein, including, for example, specific dimensions, orientations, locations, and shapes will be determined in part by the particularly intended application and use environment.

In the figures, reference numbers refer to a same or equivalent parts of the present disclosure throughout the several figures of the drawing.

DETAILED DESCRIPTION OF THE PRESENT DISCLOSURE

Reference will now be made in detail to various embodiments of the present disclosure(s), examples of which are illustrated in the accompanying drawings and described below. While the present disclosure(s) will be described in conjunction with exemplary embodiments of the present disclosure, it will be understood that the present description is not intended to limit the present disclosure(s) to those exemplary embodiments of the present disclosure. On the other hand, the present disclosure(s) is/are intended to cover not only the exemplary embodiments of the present disclosure, but also various alternatives, modifications, equivalents and other embodiments, which may be included within the spirit and scope of the present disclosure as defined by the appended claims.

Hereinafter, embodiments included in the present specification will be described in detail with reference to the accompanying drawings. The same or similar constituent elements are assigned with the same reference numerals regardless of reference numerals, and the repetitive description thereof will be omitted.

The suffixes 'module', 'unit', 'part', and 'portion' used to describe constituent elements in the following description are used together or interchangeably to facilitate the description, but the suffixes themselves do not have distinguishable meanings or functions.

In the detailed description included in the present specification, the specific descriptions of publicly known related technologies will be omitted when it is determined that the specific descriptions may obscure the subject matter of the exemplary embodiments disclosed in the present specification. Furthermore, it should be understood that the accompanying drawings are provided only to allow those skilled in the art to easily understand the exemplary embodiments disclosed in the present specification, and the technical spirit disclosed in the present specification is not limited by the accompanying drawings, and includes all alterations, equivalents, and alternatives that are included in the spirit and the technical scope of the present disclosure.

The terms including ordinal numbers such as "first," "second," and the like may be used to describe various constituent elements, but the constituent elements are not limited by the terms. These terms are used only to distinguish one constituent element from another constituent element.

When one constituent element is described as being "coupled" or "connected" to another constituent element, it should be understood that one constituent element can be coupled or directly connected to another constituent element, and an intervening constituent element can also be present between the constituent elements. When one constituent element is described as being "directly coupled to" or "directly connected to" another constituent element, it may be understood that no intervening constituent element is present between the constituent elements.

Singular expressions include plural expressions unless clearly described as different meanings in the context.

In the present specification, it should be understood the terms "comprises," "comprising," "includes," "including," "containing," "has," "having" or other variations thereof are inclusive and therefore specify the presence of stated features, integers, steps, operations, elements, components, or combinations thereof, but do not preclude the presence or addition of one or more other features, integers, steps, operations, elements, components, or combinations thereof.

Hereinafter, a busbar assembly cooling apparatus and an electric power inverter module having the same according to the exemplary embodiment of the present disclosure will be described with reference to the accompanying drawings.

Figure 2:
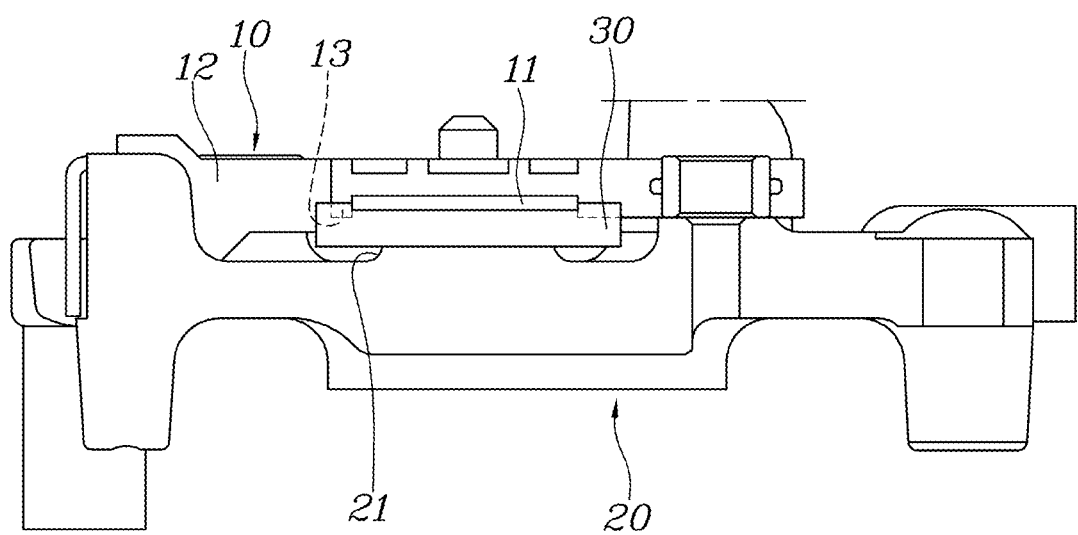
FIG. 2 is a side view of the busbar assembly cooling apparatus illustrated in FIG. 1.
Figure 3:
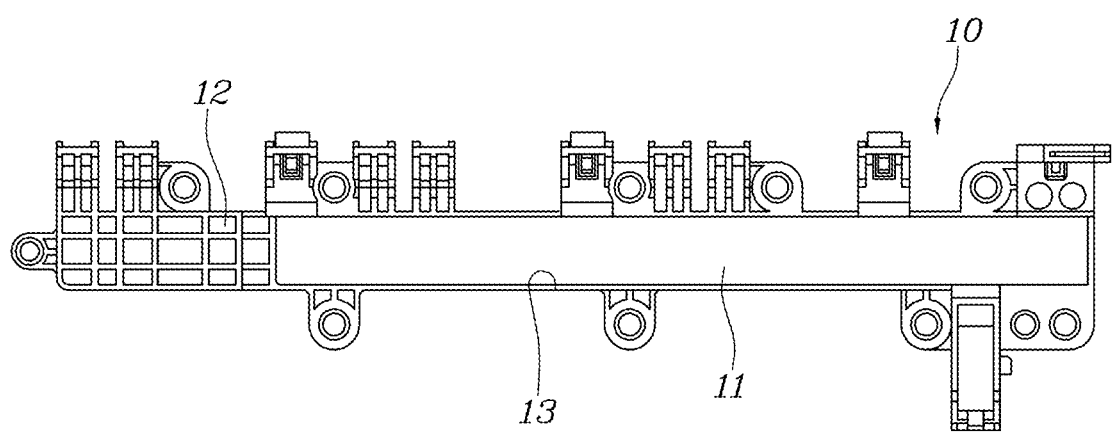
FIG. 3 is a view exemplarily illustrating a busbar assembly according to an exemplary embodiment of the present disclosure.

FIG. 1 is a view exemplarily illustrating a busbar assembly cooling apparatus according to an exemplary embodiment of the present disclosure, FIG. 2 is a side view of the busbar assembly cooling apparatus illustrated in FIG. 1, and FIG. 3 is a view exemplarily illustrating a busbar assembly according to an exemplary embodiment of the present disclosure.

Figure 4:
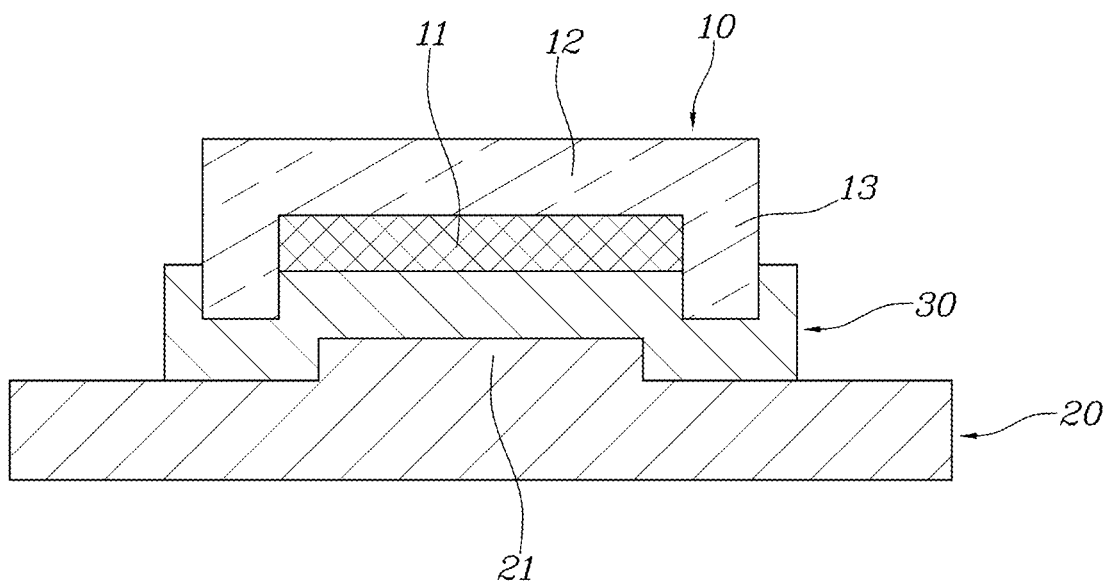
FIG. 4 is a view for explaining an effect of the busbar assembly cooling apparatus according to an exemplary embodiment of the present disclosure.
Figure 5:
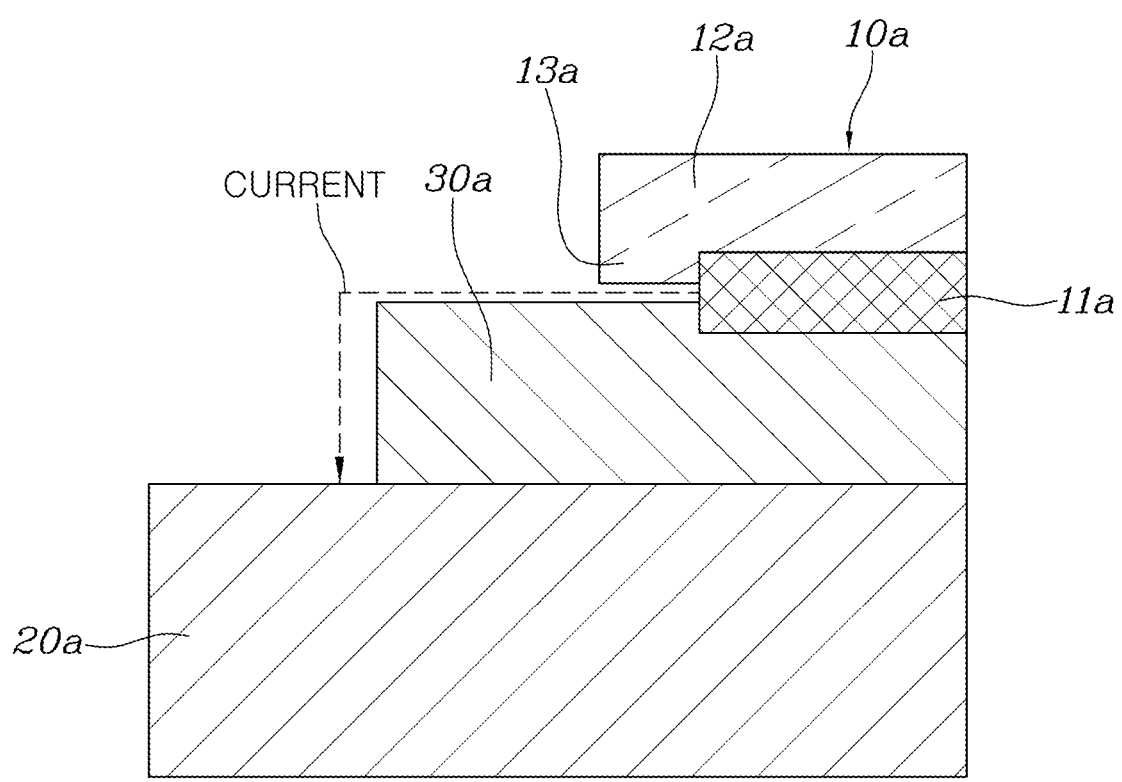
FIG. 5 is a view for explaining a problem in the related art.

FIG. 4 is a view for explaining an effect of the busbar assembly cooling apparatus according to an exemplary embodiment of the present disclosure, and FIG. 5 is a view for explaining a problem in the related art.

Figure 6:
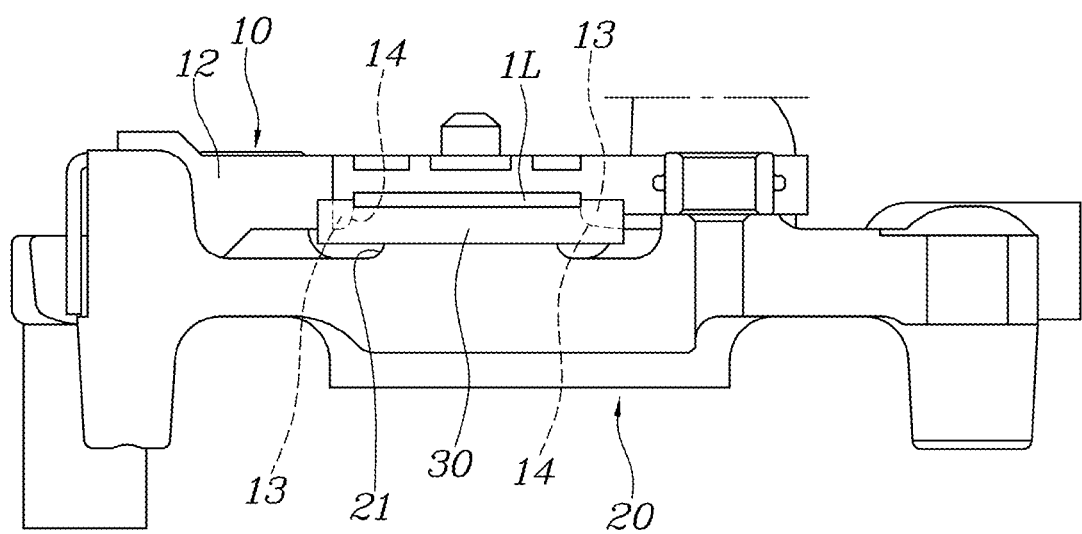
FIG. 6 is a view exemplarily illustrating another exemplary embodiment of the busbar assembly cooling apparatus according to an exemplary embodiment of the present disclosure.
Figure 7:
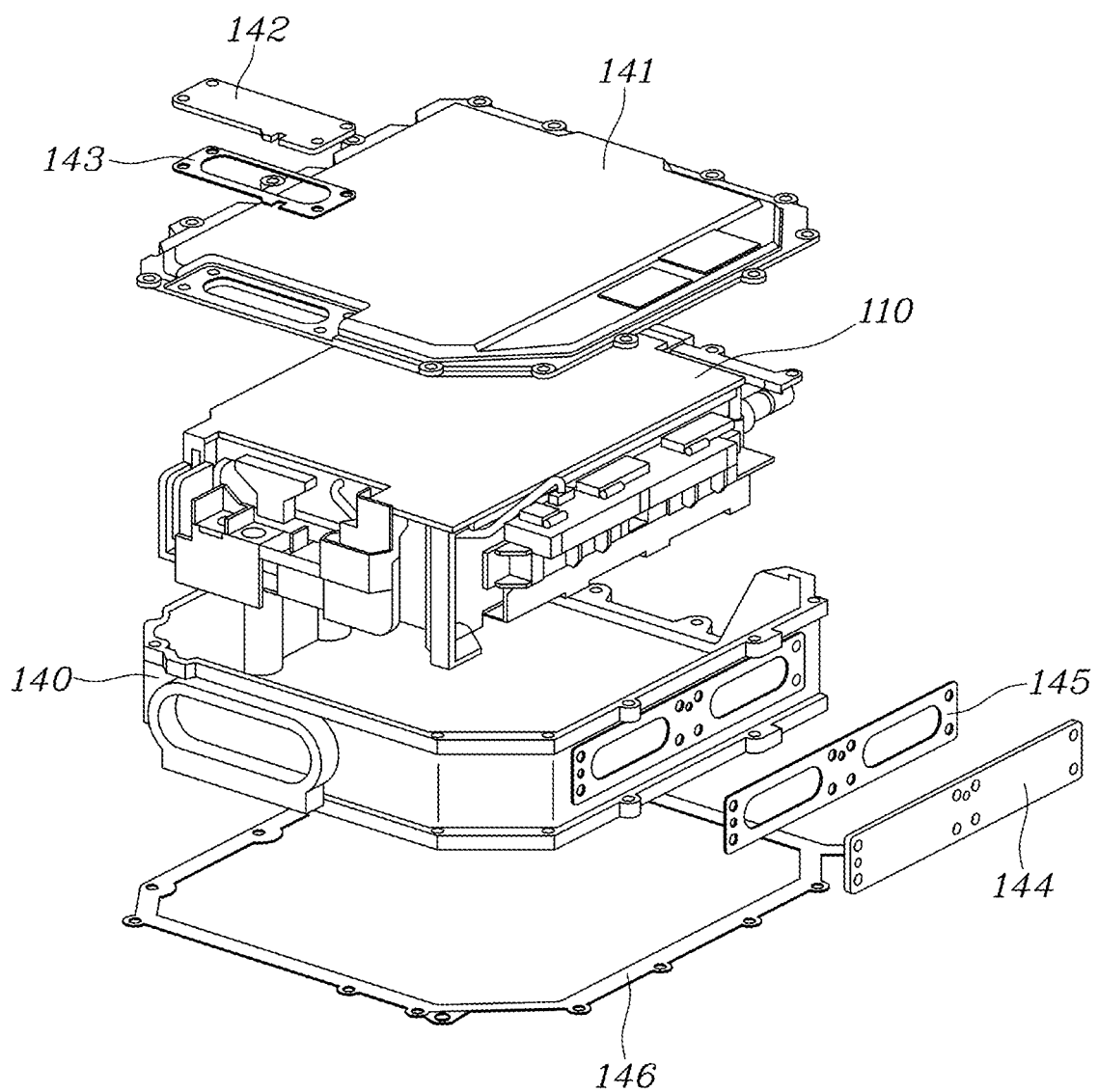
FIG. 7 is a view exemplarily illustrating an electric power inverter module according to an exemplary embodiment of the present disclosure.
Figure 8:
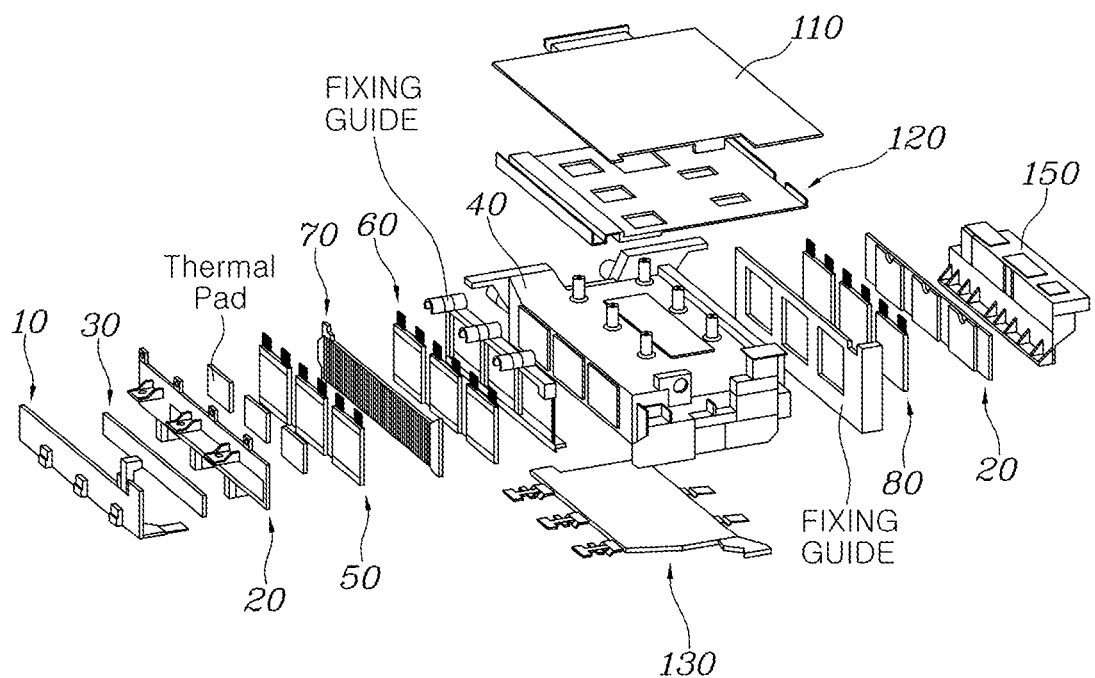
FIG. 8 is an exploded view of the electric power inverter module illustrated in FIG. 7.

Meanwhile, FIG. 6 is a view exemplarily illustrating another exemplary embodiment of the busbar assembly cooling apparatus according to an exemplary embodiment of the present disclosure, FIG. 7 is a view exemplarily illustrating an electric power inverter module according to an exemplary embodiment of the present disclosure, and FIG. 8 is an exploded view of the electric power inverter module illustrated in FIG. 7.

As illustrated in FIG. 1, FIG. 2, FIG. 3, and FIG. 4, the busbar assembly cooling apparatus according to an exemplary embodiment of the present disclosure includes: a busbar assembly 10 including a busbar 11 through which current flows, and a mold portion 12 having an external shape and configured so that the busbar 11 is accommodated thereon; a cooling cover 20 coupled to the busbar assembly 10 and configured to cool the busbar assembly 10 by heat exchange; and a thermal conductor 30 located between the mold portion 12 and the cooling cover 20 when the cooling cover 20 is coupled to the mold portion 12 of the busbar assembly 10, the thermal conductor 30 being configured to block the flow of current while coming into contact with the busbar 11 and allow the busbar 11 and the cooling cover 20 to exchange heat with each other.

The busbar assembly 10 may include the busbar 11 made of copper, and the mold portion 12 made of plastic. The cooling cover 20 may be made of steel to transfer heat. The thermal conductor 30 may be configured as a thermal pad.

Therefore, the busbar 11 of the busbar assembly 10 may dissipate heat through the cooling cover 20 by the thermal conductor 30. That is, as the cooling cover 20 exchanges heat with outside air or another cooling medium, heat generated from the busbar 11 is transferred to the cooling cover 20 by the thermal conductor 30 so that the busbar 11 is cooled. Because the busbar 11 is a conductor through which electricity flows, an electrical short-circuit occurs when the busbar 11 comes into direct contact with a medium, such as the cooling cover 20, through which electricity flows, and the electrical short-circuit may bring damage to the components. Therefore, to prevent electrical burn-out of the busbar 11 of the busbar assembly 10, the thermal conductor 30, which is configured as a thermal pad, is provided between the busbar 11 and the cooling cover 20.

However, the thermal conductor 30 may prevent direct electrical conduction between the busbar 11 and the cooling cover 20 but cannot block the current flowing along the surface of the thermal conductor 30.

Therefore, the insulation properties need to be ensured by ensuring an insulation distance to prevent electrical burn-out caused by the flow of current to an external periphery of the busbar 11. If the insulation distance between the busbar and the component through which the current may flow to the external periphery of the busbar 11 is not ensured, the short-circuit occurs, which causes damage to the components. In the instant case, the insulation distance is divided into a space distance, which is a straight distance between the busbar 11 and an electrical component, and a creeping distance which is defined along a surface of the thermal conductor 30 between the busbar 11 and the electrical component. The insulation distance may be determined by setting the space distance and the creeping distance based on electrical specifications including the voltage of the busbar 11.

The flowing methods may be applied to ensure the insulation properties of the structure of the busbar 11. For example, there is a method that expands the thermal conductor 30, which is configured as a thermal pad, by the insulation distance or longer toward the external periphery of the busbar 11. This method may ensure the insulation reliability but has a problem in that space constraint occurs because the insulation distance, which needs to be ensured, also increases in accordance with the amount of voltage applied to the busbar 11.

As another method, there is a method of surrounding the remaining surface of a cross-section of the busbar 11, except for a surface that needs to be cooled, by the mold portion 12, and bringing only the surface, which needs to be cooled, into contact with the thermal conductor 30 configured as a thermal pad, preventing the busbar 11 from being exposed. However, if a gap is formed between the mold portion 12 and the thermal pad because of damage to components occurring during an assembling process or because of manufacturing deviations between the components including the busbar assembly 10 and the thermal conductor 30, the busbar 11 may be exposed, and the current may leak.

As described above, there is a demand for a solution for ensuring cooling performance only with a small design space while ensuring stability and reliability by ensuring the insulation properties of the busbar 11.

To the present end, according to an exemplary embodiment of the present disclosure, the mold portion 12 of the busbar assembly 10 and the cooling cover 20 are structured to be inserted into the thermal conductor 30 in a direction in which the mold portion 12 and the cooling cover 20 face the thermal conductor 30, ensuring the insulation distance of the busbar 11.

With the structure in which the mold portion 12 of the busbar assembly 10 and the cooling cover 20 are inserted into the thermal conductor 30 as described above, it is possible to ensure the insulation performance without excessively increasing the size of the thermal conductor 30 to ensure the insulation performance by the thermal conductor 30. Furthermore, because the mold portion 12 of the busbar assembly 10 and the cooling cover 20 are inserted into the thermal conductor 30, the busbar 11 embedded in the mold portion 12 is completely sealed by the mold portion 12 and the thermal conductor 30, a leak of current is blocked, and the reliability is ensured.

That is, as may be seen from FIG. 5, no problem with insulation occurs in a normal condition when a busbar 11a and a mold portion 12a of a busbar assembly 10a are disposed on a straight line. However, the busbar 11a may be exposed to the air when the busbar 11a and the mold portion 12a are separated from each other because of a deviation occurring during a process of manufacturing the mold portion 12a or because of deformation of the busbar 11a. When the busbar 11a is exposed as described above, the busbar 11a cannot satisfy the sealing condition, and the current flows along the surface of a thermal conductor 30a. If a width of the thermal conductor 30a is expanded by the insulation distance or longer toward the external periphery to prevent the above-mentioned problem, there is a problem in that an overall size increases.

In contrast, according to an exemplary embodiment of the present disclosure, because the mold portion 12 of the busbar assembly 10 and the cooling cover 20 are structured to be inserted into the thermal conductor 30 as illustrated in FIG. 4, the thermal conductor 30 is positioned in a concave-convex structure between the mold portion 12 and the cooling cover 20. Therefore, because the sealing condition of the busbar 11 is satisfied even though the assembling dispersion or the deformation of the busbar 11 occurs, the occurrence of the problem with insulation is prevented.

The present disclosure will be specifically described. The mold portion 12 has an extension portion 13 protruding outwardly from the busbar 11 and configured to be inserted into the thermal conductor 30. The cooling cover 20 has a protruding portion 21 protruding in a shape configured for being inserted into the extension portion 13 and configured to be inserted into the thermal conductor 30. The extension portion 13 and the protruding portion 21 define the concave-convex structure.

That is, the mold portion 12 of the busbar assembly 10 is made of plastic and has an external shape, and the extension portion 13 extends in a direction in which the mold portion 12 faces the cooling cover 20. The extension portion 13 of the mold portion 12 may be formed to surround an external portion of the busbar 11 and extend to be inserted into the thermal conductor 30 in a state in which the busbar 11 is accommodated inside the extension portion 13.

The protruding portion 21 is formed on the cooling cover 20 in the direction in which the cooling cover 20 faces the busbar assembly 10. The protruding portion 21 of the cooling cover 20 may extend to be inserted into the extension portion 13 and be matched in shape with the busbar 11.

Because the extension portion 13 of the mold portion 12 and the protruding portion 21 of the cooling cover 20 define the concave-convex structure in which the extension portion 13 and the protruding portion 21 are fitted with each other as described above, the occurrence of the problem with insulation is prevented because the sealing condition of the busbar 11 is satisfied even though the assembling dispersion or the deformation of the busbar 11 occurs.

Meanwhile, the extension portion 13 of the mold portion 12 may extend so that a protruding length of the extension portion 13 is greater than a thickness of the busbar 11. As described above, the busbar 11 is coupled to the mold portion 12, and the extension portion 13 is formed to surround the external periphery of the busbar 11 so that the current of the busbar 11 does not leak. Because the extension portion 13 of the mold portion 12 extends to have a length greater than the thickness of the busbar 11, the extension portion 13 may pass over the busbar 11 and be inserted into the thermal conductor 30.

In the instant case, a length of the extension portion 13 may be smaller than the thickness of the busbar 11 based on a height of the protruding portion 21 of the cooling cover 20. For example, in case that the thickness of the busbar 11 is 0.5 mm and the length of the protruding portion 21 of the cooling cover 20 is 1 mm, the length of the extension portion 13 of the mold portion 12 may be set to 0.5 mm or more. Therefore, the thermal conductor 30 stably presses the busbar 11 while being pushed by the protruding portion 21 of the cooling cover 20 toward the inside of the extension portion 13 of the mold portion 12 so that the busbar 11 is sealed, and the problem with insulation is prevented. The length of the extension portion 13 of the mold portion 12 may be set to a level of ⅔ of a thickness defined before the deformation which is a deformation limit of the thermal conductor 30.

Meanwhile, a protruding length of the protruding portion 21 of the cooling cover 20 may be shorter than a protruding length of the extension portion 13 of the mold portion 12. Therefore, when the busbar assembly 10 and the cooling cover 20 are coupled to each other, the protruding portion 21 of the cooling cover 20 may push the thermal conductor 30 toward the inside of the extension portion 13 of the mold portion 12, and the thermal conductor 30 may come into contact with the busbar 11. If the protruding portion 21 of the cooling cover 20 is longer in protruding length than the extension portion 13 of the mold portion 12, the protruding portion 21 comes into direct contact with the busbar 11, which may cause an electrical short circuit, and a thickness of the thermal conductor 30 may excessively decrease between the busbar 11 and the protruding portion 21.

Furthermore, an area of the busbar 11 may be smaller than an area of the protruding portion 21 of the cooling cover 20. The present configuration is made in consideration of the deformation of the thermal conductor 30, and the area of the busbar 11 may be set to a level of ⅔ of a thickness defined before the deformation of the thermal conductor 30. For example, assuming that the width of the busbar 11 is 16 mm and the thickness of the thermal conductor 30 is 3T, the width of the protruding portion 21 of the cooling cover 20 may be set to 12 mm made by decreasing a value of the width of the busbar 11 by 2 mm which is ⅔ of the thickness of the thermal conductor 30.

As described above, the protruding length and area of the protruding portion 21 of the cooling cover 20 are set in consideration of the thickness of the thermal conductor 30 and the area of the busbar 11. Therefore, the busbar 11 is prevented from being deformed by a restoring force of the thermal conductor 30 caused by an excessive increase in size of the protruding portion 21. Furthermore, the cooling performance is prevented from being degraded by a decrease in protruding length of the protruding portion 21 and a decrease in a contact surface between the busbar 11 and the thermal conductor 30.

Meanwhile, as illustrated in FIG. 6, the extension portion 13 of the mold portion may have a chamfer 14 formed by obliquely cutting an end portion of the extension portion 13 of the mold portion. In the present disclosure, the extension portion 13 of the mold portion is formed to surround the busbar 11. When the protruding portion 21 of the cooling cover 20 pushes the thermal conductor 30 toward the busbar 11, the thermal conductor 30 is more greatly deformed. Therefore, the cooling performance and insulation performance are ensured because the busbar 11 is sealed by the thermal conductor 30. However, because the thermal conductor 30 is greatly deformed, the busbar 11 may be deformed by the restoring force of the thermal conductor 30 in accordance with hardness properties of the thermal conductor 30. Therefore, because the chamfer 14 is formed at the end portion of the extension portion 13 of the mold portion, the restoring force of the thermal conductor 30 is distributed along an inclined surface of the chamfer 14 so that the busbar 11 is prevented from being damaged by the restoring force of the thermal conductor 30.

Meanwhile, as illustrated in FIGS. 7 and 8, an electric power inverter module according to an exemplary embodiment of the present disclosure includes: a capacitor 40 configured to be supplied with direct current from a battery; a power module mounted outside the capacitor 40; a cooler 70 configured to cool the power module by a flow of a cooling medium; the busbar assembly 10 mounted outside the power module and including the busbar 11 configured to electrically connect a driving portion and the power module, and the mold portion 12 including an external shape and configured so that the busbar 11 is accommodated thereon; the cooling cover 20 coupled to the busbar assembly 10 and configured to cool the busbar assembly 10 by heat exchange; and the thermal conductor 30 located between the mold portion 12 and the cooling cover 20 when the cooling cover 20 is coupled to the mold portion 12 of the busbar assembly 10, the thermal conductor 30 being configured to block the flow of current while coming into contact with the busbar 11 and allow the busbar 11 and the cooling cover 20 to exchange heat with each other.

In the instant case, the driving portion may be a motor.

Furthermore, the power module may include a first power module 50 and a second power module 60. The cooler 70 may be disposed between the first power module 50 and the second power module 60.

In the instant case, the power module may further include a third power module 80. The third power module 80 may be disposed outside the capacitor 40 and mounted at a position different from positions of the first and second power modules 50 and 60.

That is, the power module including the first and second power modules 50 and 60 may be configured as a 1-stage inverter, and the power module further including the third power module 80 may be configured as a 2-stage inverter. The configuration in which the power module is configured as an inverter is merely an exemplary embodiment of the present disclosure, and the inverter may be configured in accordance with various embodiments by mounting various power modules. In the case of the inverter according to an exemplary embodiment of the present disclosure, the power module includes the first power module 50, the second power module 60, and the third power module 80.

In the case of the electric power inverter module according to an exemplary embodiment of the present disclosure, the capacitor 40 may be provided in a housing 140, and a separate cooling structure may be applied to the housing 140. In the instant case, the cooling structure cools the first power module 50, the second power module 60, and the third power module 80 by the flow of the cooling medium. Because the cooling structure of the inverter structure is a publicly-known technology, a detailed description thereof will be omitted.

An upper cover 141 is mounted to a platform of the housing 140 and seals the internal components including the capacitor 40, and an input cover 142 and an input cover gasket 143, which are used to assemble a DC input terminal, may be provided on the upper cover 141. Furthermore, an output cover 144 and an output cover gasket 145, which are used to assemble an AC output terminal and the driving portion, may be provided on an external surface of the housing 140. A lower gasket 146 may be mounted to a lower end portion of the housing 140 to maintain a sealed state with the driving portion.

Furthermore, the electric power inverter module according to an exemplary embodiment of the present disclosure may further include: an integrated control board 110 mounted at an upper side of the capacitor 40 and configured to control operations of the first power module 50, the second power module 60, and the third power module 80; and a board guide 120 configured to couple the integrated control board 110 to the upper side of the capacitor 40 and insulate the integrated control board 110.

That is, the integrated control board 110 may be provided at the upper side of the housing 140 and electrically connected to the capacitor 40, and the integrated control board 110 may be sealed by the upper cover 141.

Furthermore, the integrated control board 110 may be coupled to the housing 140 by the board guide 120. The board guide 120 may securely and stably fix the integrated control board 110 to the housing 140 and insulate the integrated control board 110, preventing a malfunction of the integrated control board 110.

In the instant case, the first power module 50, the second power module 60, and the third power module 80 are controlled by the integrated control board 110. The electric power inverter module according to an exemplary embodiment of the present disclosure may be controlled by a close-end winding method and an open-end winding method. The close-end winding method refers to a method that operates the driving portion by use of a single inverter because one end portion of a driving portion coil using the single inverter forms a short-circuited neutral point. The open-end winding method refers to a method that utilizes two inverters so that the inverters are respectively connected to two opposite end portions of the driving portion coil so that one end portion of the driving portion coil is not short-circuited.

For example, when the integrated control board 110 is controlled by the close-end winding method, the third power module 80 may be used, and the first power module 50 for switching may be used as a switching power module. When the integrated control board 110 is controlled by the open-end winding method, the first power module 50 and the third power module 80 may be used.

Furthermore, the first power module 50 and the second power module 60 may be used as two power modules by the open-end winding method.

In the instant case, because the first power module 50 and the second power module 60 are used as the two power modules by the open-end winding method, the cooler 70 is disposed between the first power module 50 and the second power module 60 so that the first power module 50 and the second power module 60 are cooled. The cooler 70 may be an extrusion cooler and may be configured to receive a cooling medium flowing in a cooling structure in the housing 140 and allow the cooling medium to adjust temperatures of the first and second power modules 50 and 60.

Furthermore, the electric power inverter module may further include an output busbar 130 mounted at a lower side of the capacitor 40 and configured to electrically connect the driving portion and the second power module 60. The output busbar 130 is configured to connect the second power module 60 to an external driving portion for the operation of the open-end winding method. Therefore, the second power module 60 may be connected to another external driving portion by the output busbar 130.

Meanwhile, a current sensor 150 is provided on the third power module 80 and measures the current inputted to the driving portion, preventing a malfunction of the system.

Meanwhile, the electric power inverter module according to an exemplary embodiment of the present disclosure includes: the busbar assembly 10 configured to connect the first power module 50 and the driving portion and to input the alternating current voltage, which is converted by the capacitor 40, to the external driving portion through the power module; and the cooling cover 20 configured to fix the first and second power modules 50 and 60 to the housing 140 to the outside of the first and second power modules 50 and 60.

According to an exemplary embodiment of the present disclosure, the mold portion 12 of the busbar assembly 10 and the cooling cover 20 are structured to be inserted into the thermal conductor 30 in the direction in which the mold portion 12 and the cooling cover 20 face the thermal conductor 30, ensuring the insulation distance of the busbar 11.

That is, the mold portion 12 has the extension portion 13 extending to surround the external periphery of the busbar 11 and configured to be inserted into the thermal conductor 30. The cooling cover 20 has the protruding portion 21 protruding in a shape configured for being inserted into the extension portion 13 and configured to be inserted into the thermal conductor 30. The extension portion 13 and the protruding portion 21 define the concave-convex structure.

Because the extension portion 13 of the mold portion 12 and the protruding portion 21 of the cooling cover 20 define the concave-convex structure in which the extension portion 13 and the protruding portion 21 are fitted with each other as described above, the occurrence of the problem with insulation is prevented because the sealing condition of the busbar 11 is satisfied even though the assembling dispersion or the deformation of the busbar 11 occurs.

The busbar assembly cooling apparatus and the electric power inverter module including the same, which are structured as described above, ensure the insulation performance and the cooling performance even though the size of the thermal conductor 30, which is configured as a thermal pad for insulating and cooling the busbar 11, is reduced. Furthermore, because the size of the thermal pad decreases, the internal space is ensured, and the weight and cost are reduced.

Furthermore, a space through which the busbar 11 may be externally exposed is blocked and sealed so that the stability related to the management of the busbar 11 is ensured, and the reliability of the inverter is improved.

For convenience in explanation and accurate definition in the appended claims, the terms "upper", "lower", "inner", "outer", "up", "down", "upwards", "downwards", "front", "rear", "back", "inside", "outside", "inwardly", "outwardly", "interior", "exterior", "internal", "external", "forwards", and "backwards" are used to describe features of the exemplary embodiments with reference to the positions of such features as displayed in the figures. It will be further understood that the term "connect" or its derivatives refer both to direct and indirect connection.

The foregoing descriptions of specific exemplary embodiments of the present disclosure have been presented for purposes of illustration and description. They are not intended to be exhaustive or to limit the present disclosure to the precise forms disclosed, and obviously many modifications and variations are possible in light of the above teachings. The exemplary embodiments were chosen and described in order to explain certain principles of the invention and their practical application, to enable others skilled in the art to make and utilize various exemplary embodiments of the present disclosure, as well as various alternatives and modifications thereof. It is intended that the scope of the present disclosure be defined by the Claims appended hereto and their equivalents.

What is claimed is:

1. A busbar assembly cooling apparatus comprising:
   a busbar assembly including a busbar through which current flows, and a mold portion including an external shape and configured so that the busbar is accommodated thereon;
   a cooling cover coupled to the busbar assembly and configured to cool the busbar assembly by heat exchange; and
   a thermal conductor located between the mold portion and the cooling cover coupled to the mold portion of the busbar assembly, wherein the thermal conductor is configured to block a flow of the current while coming into contact with the busbar and allow the busbar and the cooling cover to exchange heat with each other,
   wherein the mold portion of the busbar assembly and the cooling cover are structured to be inserted into the thermal conductor in a direction in which the mold portion and the cooling cover face the thermal conductor,
   wherein the mold portion has an outer part coupled with the thermal conductor to be surrounded by the thermal conductor from an outside of the busbar, and
   wherein the cooling cover has a middle part coupled with the thermal conductor to be fixed into the thermal conductor.

2. The busbar assembly cooling apparatus of claim 1,
   wherein the mold portion includes an extension portion protruding outwardly from the busbar and configured to be inserted into the thermal conductor,
   wherein the cooling cover includes a protruding portion protruding for being inserted into the extension portion and configured to be inserted into the thermal conductor, and
   wherein the extension portion and the protruding portion define a concave-convex structure, and
   wherein the extension portion corresponds to the outer part of the mold portion, and the protruding portion corresponds to the middle part of the cooling cover.

3. The busbar assembly cooling apparatus of claim 2,
   wherein the extension portion extends in a direction in which the mold portion faces the cooling cover, and
   wherein the extension portion of the mold portion surrounds an external portion of the busbar and extends to be inserted into the thermal conductor in a state in which the busbar is accommodated inside the extension portion.

4. The busbar assembly cooling apparatus of claim 2, wherein the extension portion of the mold portion extends so that a protruding length of the extension portion is greater than a thickness of the busbar.

5. The busbar assembly cooling apparatus of claim 2, wherein a protruding length of the protruding portion of the cooling cover is shorter than a protruding length of the extension portion of the mold portion.

6. The busbar assembly cooling apparatus of claim 2, wherein an area of the busbar is smaller than an area of the protruding portion of the cooling cover.

7. The busbar assembly cooling apparatus of claim 2, wherein the extension portion of the mold portion has a chamfer formed by obliquely cutting an end portion of the extension portion of the mold portion.

8. An electric power inverter module comprising:
- a capacitor configured to be supplied with direct current from a battery;
- a power module mounted outside the capacitor;
- a cooler configured to cool the power module by a flow of a cooling medium;
- a busbar assembly mounted outside the power module and including a busbar configured to electrically connect a driving portion and the power module, and a mold portion including an external shape and configured so that the busbar is accommodated thereon;
- a cooling cover coupled to the busbar assembly and configured to cool the busbar assembly by heat exchange; and
- a thermal conductor located between the mold portion and the cooling cover coupled to the mold portion of the busbar assembly,
- wherein the thermal conductor is configured to block a flow of current while coming into contact with the busbar and allow the busbar and the cooling cover to exchange heat with each other.

9. The electric power inverter module of claim 8, wherein the mold portion of the busbar assembly and the cooling cover are structured to be inserted into the thermal conductor in a direction in which the mold portion and the cooling cover face the thermal conductor.

10. The electric power inverter module of claim 8,
- wherein the mold portion has an extension portion extending to surround an external periphery of the busbar and configured to be inserted into the thermal conductor in a state in which the busbar is accommodated inside the extension portion,
- wherein the cooling cover includes a protruding portion protruding for being inserted into the extension portion and configured to be inserted into the thermal conductor, and
- wherein the extension portion and the protruding portion define a concave-convex structure.

11. The electric power inverter module of claim 8,
- wherein the extension portion of the mold portion extends so that a protruding length of the extension portion is greater than a thickness of the busbar.

12. The electric power inverter module of claim 8,
- wherein a protruding length of the protruding portion of the cooling cover is shorter than a protruding length of the extension portion of the mold portion.

13. The electric power inverter module of claim 8,
- wherein an area of the busbar is smaller than an area of the protruding portion of the cooling cover.

14. The electric power inverter module of claim 8,
- wherein the extension portion of the mold portion has a chamfer formed by obliquely cutting an end portion of the extension portion of the mold portion.

15. The electric power inverter module of claim 8, wherein the power module includes a first power module and a second power module, and the cooler is disposed between the first power module and the second power module.

16. The electric power inverter module of claim 15, wherein the power module further includes a third power module, and the third power module is disposed outside the capacitor and mounted at a position different from positions of the first and second power modules.

17. The electric power inverter module of claim 16, further including:
- an integrated control board mounted at an upper side of the capacitor and configured to control operations of the first power module, the second power module, and the third power module; and
- a board guide configured to couple the integrated control board to the upper side of the capacitor and insulate the integrated control board.

18. The electric power inverter module of claim 15, wherein the busbar assembly is mounted outside the second power module and electrically connects the driving portion and the first power module.

19. The electric power inverter module of claim 18, further including:
- an output busbar mounted at a lower side of the capacitor and configured to electrically connect the driving portion and the second power module.

* * * * *